(12) United States Patent
Hu

(10) Patent No.: US 12,009,329 B2
(45) Date of Patent: Jun. 11, 2024

(54) MANUFACTURING METHOD OF INTEGRATED SUBSTRATE

(71) Applicant: Dyi-Chung Hu, Hsinchu (TW)

(72) Inventor: Dyi-Chung Hu, Hsinchu (TW)

( * ) Notice: Subject to any disclaimer, the term of this patent is extended or adjusted under 35 U.S.C. 154(b) by 543 days.

(21) Appl. No.: 17/397,975

(22) Filed: Aug. 9, 2021

(65) Prior Publication Data

US 2021/0382088 A1 Dec. 9, 2021

Related U.S. Application Data

(62) Division of application No. 16/891,078, filed on Jun. 3, 2020, now Pat. No. 11,125,781.

(51) Int. Cl.
| | | |
|---|---|---|
| *H01L 23/00* | (2006.01) | |
| *G01R 1/073* | (2006.01) | |
| *G01R 3/00* | (2006.01) | |
| *G01R 31/28* | (2006.01) | |
| *H01L 21/66* | (2006.01) | |

(52) U.S. Cl.
CPC .......... *H01L 24/19* (2013.01); *G01R 1/07378* (2013.01); *G01R 3/00* (2013.01); *G01R 31/2884* (2013.01); *G01R 31/2886* (2013.01); *H01L 22/30* (2013.01); *H01L 24/20* (2013.01)

(58) Field of Classification Search
CPC ......... H01L 24/19; H01L 22/30; H01L 24/20; H01L 22/34; H01L 21/67; G01R 1/07378; G01R 3/00; G01R 31/2884; G01R 31/2886; G01R 1/07364
See application file for complete search history.

(56) References Cited

U.S. PATENT DOCUMENTS

2021/0199696 A1 * 7/2021 Ahn ................... G01R 1/07342

* cited by examiner

*Primary Examiner* — Latanya N Crawford Eason
(74) *Attorney, Agent, or Firm* — JCIPRNET

(57) ABSTRACT

A semiconductor manufacturing method includes forming a first redistribution structure with a fine redistribution circuitry over a first temporary carrier; forming testing tips on a first surface of the fine redistribution circuitry; transferring the testing tips and the first redistribution structure to a second temporary carrier provided with a temporary adhesive layer, where the testing tips are embedded in the temporary adhesive layer with the second temporary carrier disposed on the temporary adhesive layer; releasing the first temporary carrier to expose a second surface of the fine redistribution circuitry; coupling a second redistribution structure with a coarse redistribution circuitry to the first redistribution structure through conductive joints, where the conductive joints are formed on the second surface of the fine redistribution circuitry; and releasing the second temporary carrier and the temporary adhesive layer from the testing tips and the first redistribution structure after coupling the second redistribution structure.

10 Claims, 6 Drawing Sheets

MANUFACTURING METHOD OF INTEGRATED SUBSTRATE

CROSS REFERENCE TO RELATED APPLICATIONS

This application is a divisional application of and claims the priority benefit of U.S. application Ser. No. 16/891,078, filed on Jun. 3, 2020, now allowed. The entirety of the above-mentioned patent applications is hereby incorporated by reference herein and made a part of specification.

BACKGROUND OF THE INVENTION

1. Field of the Invention

The present invention relates to a manufacturing method of an integrated substrate, and more specifically relates to a manufacturing method of an integrated substrate for connecting a signal source and probing a semiconductor wafer.

2. Description of Related Art

As the electronic industry has rapidly developed, the trend in semiconductor dies has been to gradually move toward miniaturization and integration. The testing pad pitches of highly integrated semiconductor die has become narrower, whereas the degree to which a device for probing or testing such highly integrated semiconductor dies can have a fine pitch is limited. In this respect, an integrated substrate used in the electric testing as high performance space transformer is desired in the field.

SUMMARY OF THE INVENTION

The invention provides an integrated substrate and a method. The integrated substrate configured to connect a signal source and probe a semiconductor wafer provides a fine circuitry side for mating with the testing tips and a coarse circuitry side for mating with the testing circuit board of the signal source, thereby thinning of a structure of testing apparatus and increasing flexibility of a space transformer.

The invention provides an integrated substrate for testing a semiconductor wafer. The integrated substrate includes a first redistribution structure including a fine redistribution circuitry, a plurality of testing tips disposed on a first surface of the first redistribution structure and electrically connected to the fine redistribution circuitry to probe the semiconductor wafer, a second redistribution structure including a coarse redistribution circuitry and disposed over a second surface of the first redistribution structure opposite to the first surface, and a plurality of conductive joints interposed between the coarse redistribution circuitry and the fine redistribution circuitry to provide electrical connections therebetween. A layout density of the fine redistribution circuitry is denser than that of the coarse redistribution circuitry.

In some embodiments, the integrated substrate further includes an underfill layer interposed between the first redistribution structure and the second redistribution structure to laterally cover the plurality of conductive joints. In some embodiments, the integrated substrate further includes a plurality of conductive terminals disposed on and electrically connected to the coarse redistribution circuitry of the second redistribution structure and located opposite to the plurality of conductive joints. In some embodiments, the plurality of conductive joints are solder joints, and the plurality of conductive terminals are solder terminals. In some embodiments, the first redistribution structure further includes a fine dielectric layer covering the fine redistribution circuitry, and the fine dielectric layer and the fine redistribution circuitry at the second surface of the first redistribution structure are substantially flush. In some embodiments, a sidewall of the first redistribution structure and a sidewall of the second redistribution structure are substantially leveled. In some embodiments, a coarse dielectric layer of the second redistribution structure that covers the coarse redistribution circuitry is thicker and more rigid than a fine dielectric layer of the first redistribution structure that covers the fine redistribution circuitry. In some embodiments, a pitch of adjacent two of the plurality of testing tips matches a fine-pitch requirement of the semiconductor wafer to be tested, and the plurality of testing tips are arranged to be in direct contact with the semiconductor wafer to be tested.

The invention further provides a method that includes at least the following steps. A first redistribution structure including a fine redistribution circuitry is formed over a first temporary carrier. A plurality of testing tips is formed on the fine redistribution circuitry of the first redistribution structure. The plurality of testing tips and the first redistribution structure are transferred to a second temporary carrier with a temporary adhesive layer, where the plurality of testing tips are embedded in the temporary adhesive layer with the second temporary carrier disposed on the temporary adhesive layer. The first temporary carrier is released to expose a surface of the fine redistribution circuitry of the first redistribution structure. A second redistribution structure including a coarse redistribution circuitry is coupled to the first redistribution structure through a plurality of conductive joints, where the plurality of conductive joints are formed on the surface of the fine redistribution circuitry of the first redistribution structure. The second temporary carrier and the temporary adhesive layer are released from the plurality of testing tips and the first redistribution structure after coupling the second redistribution structure.

In some embodiments, forming the first redistribution structure includes forming the fine redistribution circuitry and a fine dielectric layer over the first temporary carrier, and after releasing the first temporary carrier, the fine redistribution circuitry and the fine dielectric layer are substantially leveled. In some embodiments, the method further includes after coupling the second redistribution structure to the first redistribution structure, forming an underfill layer between the first redistribution structure and the second redistribution structure to cover the plurality of conductive joints. In some embodiments, the first redistribution structure and the second redistribution structure are separately fabricated, and during coupling the second redistribution structure to the first redistribution structure, the second redistribution structure is disposed over the first redistribution structure, where an orthographic projection area of the second redistribution structure on the first redistribution structure is less than a surface area of the first redistribution structure. In some embodiments, the method further includes after coupling the second redistribution structure to the first redistribution structure, trimming a redundant portion of the first redistribution structure that is not covered by the second redistribution structure. In some embodiments, trimming the redundant portion of the first redistribution structure is performed before releasing the second temporary carrier and the temporary adhesive layer. In some embodiments, the method further includes probing a semiconductor wafer to be tested by the plurality of testing tips after releasing the second temporary carrier and the temporary adhesive layer, where a signal source for testing the semiconductor wafer is transmitted from the second redistribution structure to the plurality of testing tips through the plurality of conductive joints and the first redistribution structure. In some embodiments, the method further includes de-coupling the first redistribution structure and the plurality of testing tips from the second redistribution structure, and mounting the second redistribution structure onto another module of the first redistribution structure and the plurality of testing tips. In some embodiments, the method further includes forming a plurality of conductive terminals on the coarse redistribution circuitry of the second redistribution structure opposite to the plurality of conductive joints, where the plurality of conductive terminals is connected to the signal source for testing the semiconductor wafer before probing the semiconductor wafer to be tested.

Based on the above, the integrated substrate functioning as a space transformer for electrical testing a semiconductor wafer includes separately fabricated first redistribution structure and second redistribution structure, and the first redistribution structure and the second redistribution structure are connected together by the conductive joints. By such mechanism, the first redistribution structure with testing tips formed thereon may be easily removed from the second redistribution structure and replaced with another module of first redistribution structure and the testing tips. The integrated substrate can meet various pitch requirements of different types of semiconductor wafer to be tested by replacing the first redistribution structure and the testing tips. Moreover, the first redistribution structure and the testing tips can be replaced if short-circuit or broken tips occurs, without a significant increase in manufacturing cost. The integrated substrate may also provide a high bandwidth and low latency scheme for testing a semiconductor wafer.

To make the above features and advantages of the present invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
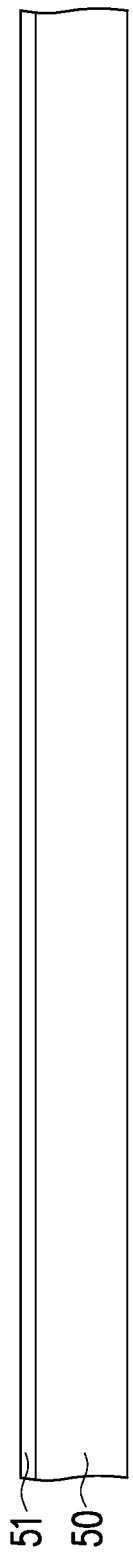
FIG. 1A to FIG. 1F are schematic cross-sectional views illustrating a manufacturing method of an integrated substrate according to some embodiments of the invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1A to FIG. 1F are schematic cross-sectional views illustrating a manufacturing method of an integrated substrate according to some embodiments of the invention. Referring to FIG. 1A, a first temporary carrier 50 is provided with a release layer 51. For example, the first temporary carrier 50 may be made of glass, plastic, silicon, metal, or other suitable materials as long as the material is able to withstand the subsequent processes while carrying a structure formed thereon. In some embodiments, the release layer 51 (e.g., a light to heat conversion film, or other suitable de-bonding layer) is applied on the first temporary carrier 50 to enhance the releasibility of the subsequently formed structure from the first temporary carrier 50 in a subsequent de-bonding process.

Figure 1B:
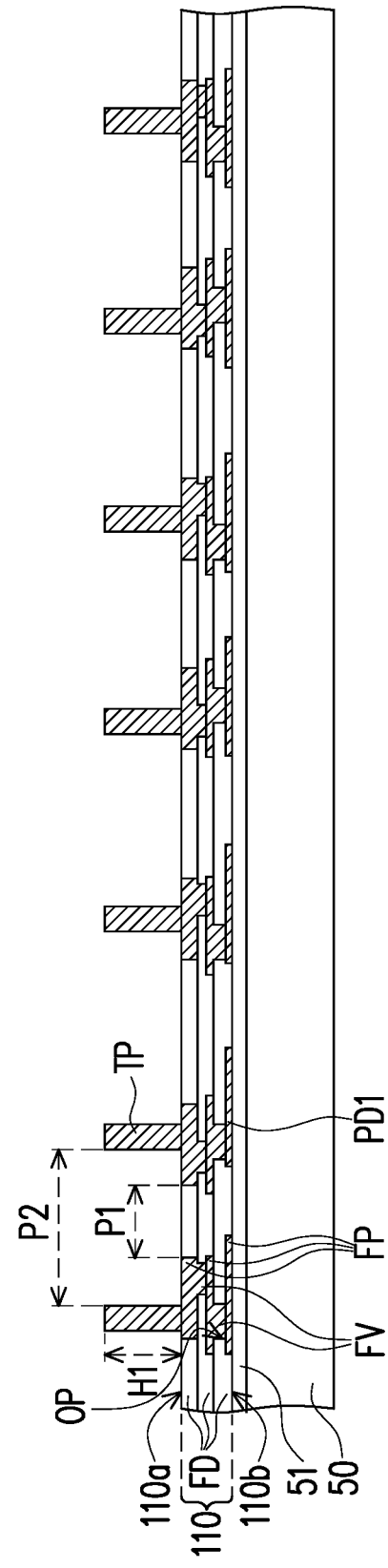

Referring to FIG. 1B, a first redistribution structure 110 and a plurality of testing tips TP are formed over the first temporary carrier 50. For example, the first redistribution structure 110 including fine conductive patterns FP, fine dielectric layers FD, and fine conductive vias FV is formed on the release layer 51 over the first temporary carrier 50. The fine conductive patterns FP and the fine conductive vias FV may be collectively viewed as a fine redistribution circuitry that is embedded in the fine dielectric layers FD. In some embodiments, the fine dielectric layers FD are stacked upon one another, and the material of the fine dielectric layers FD may be or may include polyimide (PI), benzocyclobutene (BCB), polybenzoxazole (PBO), inorganic dielectric material (e.g., silicon oxide, silicon nitride, or the like), or other suitable electrically insulating materials. The materials of the fine conductive pattern FP and the fine conductive via FV may be or may include copper, gold, nickel, aluminium, platinum, tin, combinations thereof, an alloy thereof, or another suitable conductive material.

Continue to FIG. 1A, the fine conductive pattern FP may be formed and patterned on the release layer 51 over the first temporary carrier 50 using a deposition process, a lithography process and an etching process, or other suitable processes. In some embodiments, the fine conductive pattern FP at the bottom level includes a plurality of conductive pads PD1 for subsequently element-mounting process. Next, the fine dielectric layer FD including a plurality of openings OP may be formed over the first temporary carrier 50 to cover the fine conductive pattern FP using, for example, a coating process, lithography and etching processes, or other suitable processes. The openings of the fine dielectric layer FD may expose at least the portion of the fine conductive pattern FP for electrical connection. In other embodiments, the fine dielectric layer FD is formed before the formation of the fine conductive pattern FP.

Subsequently, a conductive material may be formed in the openings OP of the fine dielectric layer FD to form the fine conductive vias FV using suitable plating or deposition process. The term "conductive vias" may be the elements that provide electrical connection between layers and go through the plane of one or more adjacent layers. The conductive material may also be formed on the top surface of fine dielectric layer FD when forming the conductive material in the openings OP, and then the conductive material on the top surface of fine dielectric layer FD patterned to form another level of the fine conductive pattern FP. The fine conductive pattern FP on the top surface of fine dielectric layer FD may include conductive lines and conductive pads. In some embodiments, the fine conductive pattern FP is referred to as a patterned conductive layer with fine line/space routing. For example, the pitch P1 between adjacent fine conductive patterns FP is in a range of about 2 μm to about 10 μm. Although the pitch greater than or less than 2 μm and/or 10 μm may be possible depending on the product requirements.

The abovementioned steps may be performed multiple times such that the fine conductive patterns FP and the fine dielectric layers FD are alternately stacked and the fine conductive vias FV are embedded in the fine dielectric layers FD. The fine conductive vias FV may be formed to be electrically and physically connected between the fine conductive patterns FP in different layers. In some embodiments, the first redistribution structure 110 is a stack of layers having fine line/space routing. It should be noted that the first redistribution structure shown in FIG. 1A is merely exemplary, more levels or less levels of the redistribution structure may be formed as required by the circuit design.

Continue to FIG. 1A, the first redistribution structure 110 includes a first surface 110a and a second surface 110b opposite to each other, where the second surface 110b faces towards the first temporary carrier 50. The fine conductive pattern FP and the fine dielectric layer FD at the second surface 110b of the first redistribution structure 110 may be substantially leveled. In some embodiments, the fine conductive pattern FP and the fine dielectric layer FD at the first surface 110a of the first redistribution structure 110 may be substantially leveled as well. In other embodiments, the fine conductive pattern FP at the first surface 110a is not laterally covered by the fine dielectric layer FD. In some embodiments, the fine conductive vias FV include vertical sidewalls with respective to the second surface 110b. In other embodiments, the fine conductive vias FV are tapered towards the first temporary carrier 50.

Still referring to FIG. 1A, the testing tips TP are subsequently formed on the first surface 110a of the first redistribution structure 110. For example, the testing tips TP are formed on the topmost level of the fine conductive patterns FP by plating or other suitable deposition process. In some embodiments, the testing tips TP are copper pillars formed on the fine conductive pattern FP. The testing tips TP may be configured to probe a semiconductor wafer (see FIG. 2). The pitch P2 of the adjacent testing tips TP may match the fine-pitch requirement of testing pads of the semiconductor wafer to be tested. For example, the pitch P2 of the adjacent testing tips TP is about 40 μm or less than 40 μm. The pitch P2 of the adjacent testing tips TP may range from about 5 μm to about 100 μm. In some embodiments, the height H1 of the respective testing tip TP is about 10 μm to about 150 μm. Although the pitch and the height beyond these ranges may be possible depending on the product requirements.

Figure 1C:
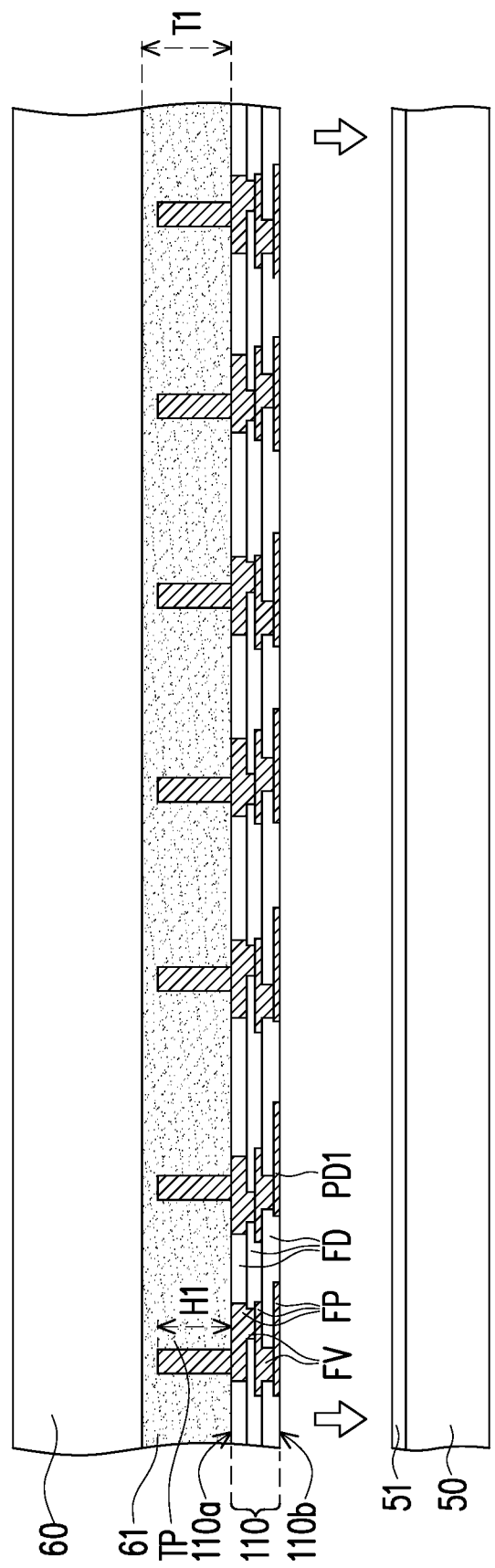

Referring to FIG. 1C, the testing tips TP and the first redistribution structure 110 may be transferred to a second temporary carrier 60 with a temporary adhesive layer 61. For example, the second temporary carrier 60 with the temporary adhesive layer 61 may be bonded to the testing tips TP and the first redistribution structure 110, and the first temporary carrier 50 and the release layer 51 are removed from the first redistribution structure 110. For example, the temporary adhesive layer 61 is formed on the first surface 110a of the first redistribution structure 110, and the testing tips TP formed on the first surface 110a of the first redistribution structure 110 may be embedded in the temporary adhesive layer 61. In some embodiments, the temporary adhesive layer 61 covers the fine dielectric layer FD and the fine conductive pattern FP at the first surface 110a of the first redistribution structure 110. In some embodiments, the temporary adhesive layer 61 is thick enough to bury the testing tips TP therein. For example, the thickness T1 of the temporary adhesive layer 61 is greater than the height H1 of the respective testing tips TP.

The second temporary carrier 60 may be made of glass, plastic, silicon, metal, or other suitable materials as long as the material is able to withstand the subsequent processes while carrying a structure formed thereon. In some embodiments, the temporary adhesive layer 61 may be or may include thermoplastic materials, pressure sensitive material, silicon containing material, or other suitable adhesive that can be used in temporary bonding of semiconductor material. In some embodiments, the temporary adhesive layer 61 that may be in a liquid or semi-liquid form is applied to the first surface 110a of the first redistribution structure 110 by such as a spin-coating process or other suitable deposition process. In some embodiments, a curing process is performed to solidify the temporary adhesive layer 61, such that the temporary adhesive layer 61 becomes more mechanically stable. In some embodiments, the temporary adhesive layer 61 is in a tape or film form, and the tape application mechanism may be used to apply the temporary adhesive layer 61 to the first redistribution structure 110. For example, after bonding the second temporary carrier 60 to the resulting structure through the temporary adhesive layer 61, the first redistribution structure 110 and the testing tips TP are sandwiched between the first temporary carrier 50 and the second temporary carrier 60.

Continue to FIG. 1C, after bonding the first redistribution structure 110 and the testing tips TP to the second temporary carrier 60, the first temporary carrier 50 is released from the first redistribution structure 110. For example, the first temporary carrier 50 is removed from the second surface 110b of the first redistribution structure 110 by applying external energy (e.g., heat and/or pressure, etc.) to the release layer 51 located between the first redistribution structure 110 and the first temporary carrier 50, thereby delaminating the release layer 51 from the first redistribution structure 110. Other suitable processes may be used to remove the first temporary carrier 50 and the release layer 51. A cleaning process is optionally performed on the second surface 110b of the first redistribution structure 110 to remove the residues of the release layer 51. As shown in FIG. 1C, the bottommost level of the fine conductive patterns FP (e.g., the conductive pads PD1) may be revealed for further electrical connection.

Figure 1D:
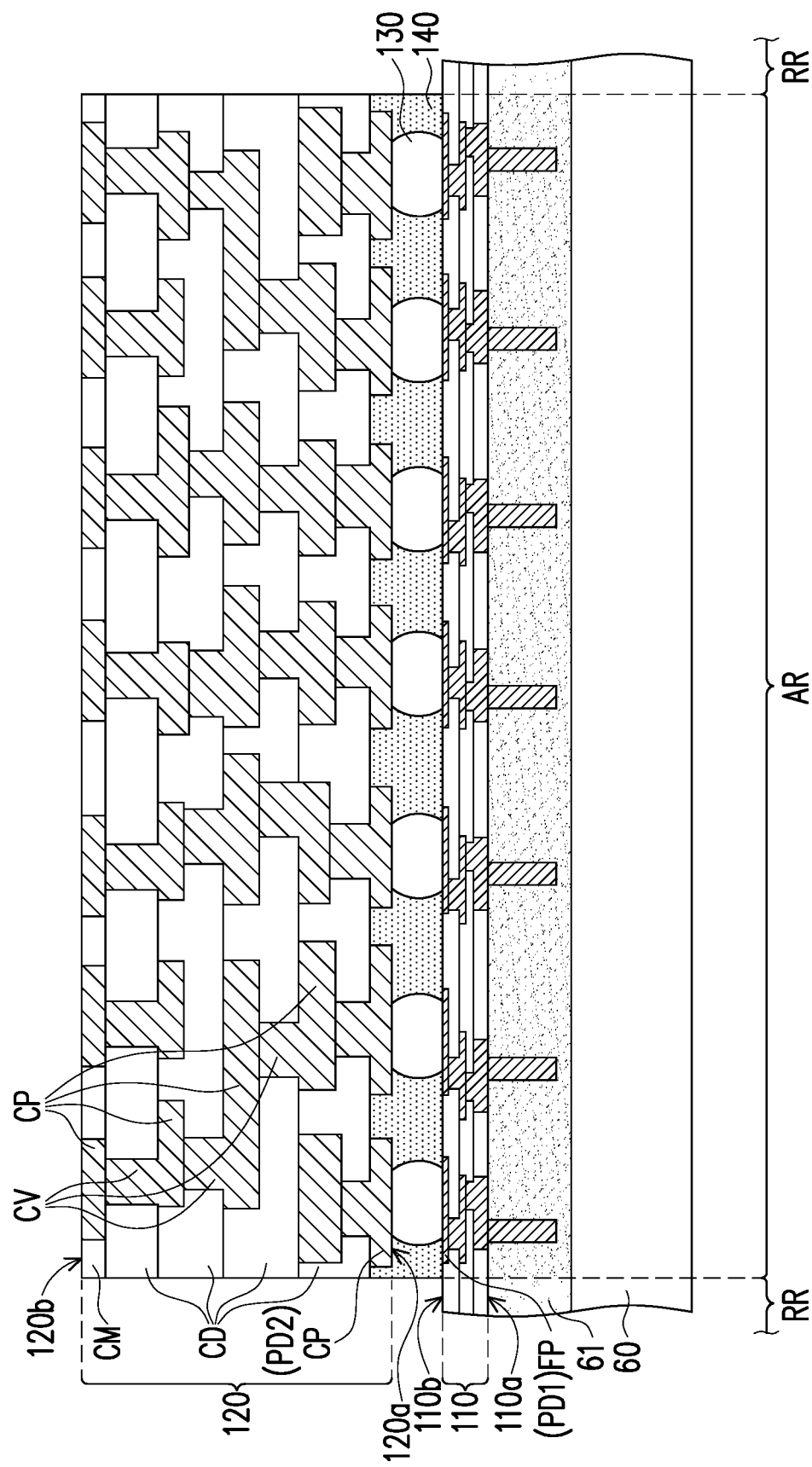

Referring to FIG. 1D, a second redistribution structure 120 may be disposed over the first redistribution structure 110 and may be electrically coupled to the first redistribution structure 110 through a plurality of conductive joints 130. In some embodiments, the entire thickness of the second redistribution structure 120 is greater than the entire thickness of the first redistribution structure 110. The first redistribution structure 110 may be formed as a thin film, and the second redistribution structure 120 may be more rigid than the first redistribution structure 110 and may be viewed as a substrate in accordance with some embodiments. For example, the first redistribution structure 110 and the second redistribution structure 120 are separately fabricated, and the second redistribution structure 120 may be picked and placed over the first redistribution structure 110. The orthographic projection area of the second redistribution structure 120 on the second surface 110b of the first redistribution structure 110 may be less than the surface area of the second surface 110b of the first redistribution structure 110. For example, the first redistribution structure 110 includes an active region AR and a redundant region RR surrounding the active region AR, where the second redistribution structure 120 is mounted on the active region AR of the first redistribution structure 110.

For example, the second redistribution structure 120 includes coarse dielectric layers CD stacked upon one another, coarse conductive patterns CP embedded in the coarse dielectric layers CD, coarse conductive vias CV embedded in the coarse dielectric layers CD and connected to the adjacent levels of the coarse conductive patterns CP, and a solder mask layer CM stacked on the topmost one of the coarse dielectric layers CD to cover the topmost one of the coarse conductive patterns CP. The coarse conductive patterns CP and the coarse conductive vias CV may be collectively viewed as a coarse redistribution circuitry that is embedded in the coarse dielectric layers CD. It should be noted that the second redistribution structure shown in FIG. 1D is merely exemplary, more levels or less levels of the redistribution structure may be formed as required by the circuit design.

In some embodiments, the material of the coarse dielectric layers CD may be or may include ceramics such as titanium oxide, organic dielectric, or other suitable electrically insulating materials. For example, the coarse dielectric layers CD are formed by lamination or other suitable deposition process. The materials of the coarse conductive patterns CP and the coarse conductive vias CV may be or may include copper, gold, nickel, aluminium, platinum, tin, combinations thereof, an alloy thereof, or another suitable conductive material. For example, the coarse conductive patterns CP and the coarse conductive vias CV are formed by plating or other suitable deposition process.

For example, the respective coarse conductive patterns CP and coarse conductive vias CV are coarser and thicker than the fine conductive patterns FP and the fine conductive vias FV of the first redistribution structure 110. For example, the fine conductive pattern FP of the first redistribution structure 110 has line-spacing (L/S) pitches finer than the coarse conductive pattern CP of the second redistribution structure 120. In some embodiments, a dimension (e.g., height, depth, width, outer diameter, etc.) of the respective coarse conductive via CV is greater than that of the fine conductive via FV of the first redistribution structure 110. The coarse dielectric layer CD at each level may also be thicker and more rigid than the respective fine dielectric layer FP.

Continue to FIG. 1D, the second redistribution structure 120 includes a first surface 120a and a second surface 120b opposite to each other. The coarse conductive pattern CP and the solder mask layer CM at the second surface 120b of the second redistribution structure 120 may be substantially flush. In some other embodiments, the solder mask layer CM partially covers the topmost one of the coarse conductive patterns CP and has a plurality of openings exposing at least a portion of the topmost one of the coarse conductive patterns CP for further electrical connection. In some embodiments, the coarse conductive patterns CP at the first surface 120a of the second redistribution structure 120 include conductive pads PD2 for the conductive joints 130 mounted thereon. In some embodiments, the second redistribution structure 120 may be viewed as a printed circuit board (PCB).

For example, the conductive joints 130 are connected to the coarse conductive patterns CP at the first surface 120a of the second redistribution structure 120 (e.g., the conductive pads PD2) and the fine conductive patterns FP at the second surface 110b of the first redistribution structure 110 (e.g., the conductive pads PD1). In some embodiments, the material of the conductive joints 130 includes solder or the like. The conductive joints 130 may be referred to as solder joints. For example, the solder pastes may be printed on the fine conductive patterns FP at the second surface 110b (e.g., the conductive pads PD1) and/or the coarse conductive patterns CP at the first surface 120a (e.g., the conductive pads PD2). Next, the second redistribution structure 120 may be disposed over the second surface 110b of the first redistribution structure 110, and then a reflow process may be performed to form the conductive joints 130.

Continue to FIG. 1D, an underfill layer 140 may be formed between the first redistribution structure 110 and the second redistribution structure 120 to cover the conductive joints 130 for protection. For example, the underfill layer 140 fills the gap between the second surface 110b of the first redistribution structure 110 and the first surface 120a of the second redistribution structure 120.

Figure 1E:
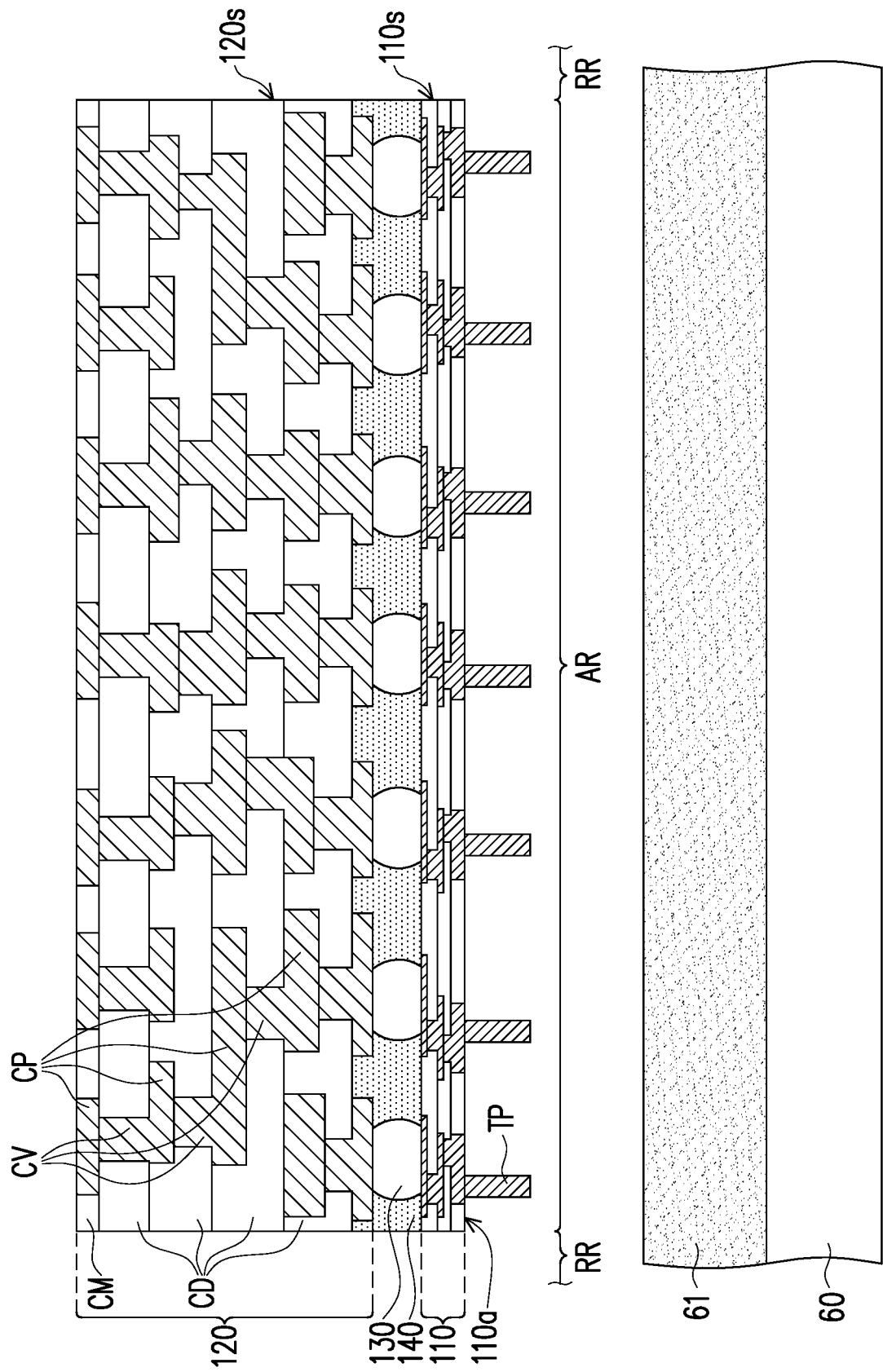

Referring to FIG. 1E, a portion of the first redistribution structure 110 that is not covered by the second redistribution structure 120 may be removed, and the second temporary carrier 60 and the temporary adhesive layer 61 may be removed from the first redistribution structure 110. For example, the portion of the first redistribution structure 110 in the redundant region RR may be trimmed using any suitable process such as dicing, laser cutting, etc. In some embodiment, during the trimming process, the underfill layer 140 located in the redundant region RR may also be removed together with the underlying first redistribution structure 110. Under this scenario, the sidewall of the underfill layer 140 may be substantially leveled with the outer sidewall 110s of the first redistribution structure 110. In some embodiments, after trimming, the outer sidewall 110s of the first redistribution structure 110 may be substantially leveled with the outer sidewall 120s of the second redistribution structure 120.

In some embodiments, the step of removing the second temporary carrier 60 and the temporary adhesive layer 61 is performed after the trimming step. For example, the second temporary carrier 60 is removed from the first redistribution structure 110 and the testing tips TP by applying external energy to the temporary adhesive layer 61, so that the temporary adhesive layer 61 loses its adhesion and may be from the first redistribution structure 110 and the testing tips TP. Other suitable processes may be used to remove the second temporary carrier 60 and the temporary adhesive layer 61. A cleaning process is optionally performed on the testing tips TP and the first surface 110a of the first redistribution structure 110 to remove the residue of the temporary adhesive layer 61.

Figure 1F:
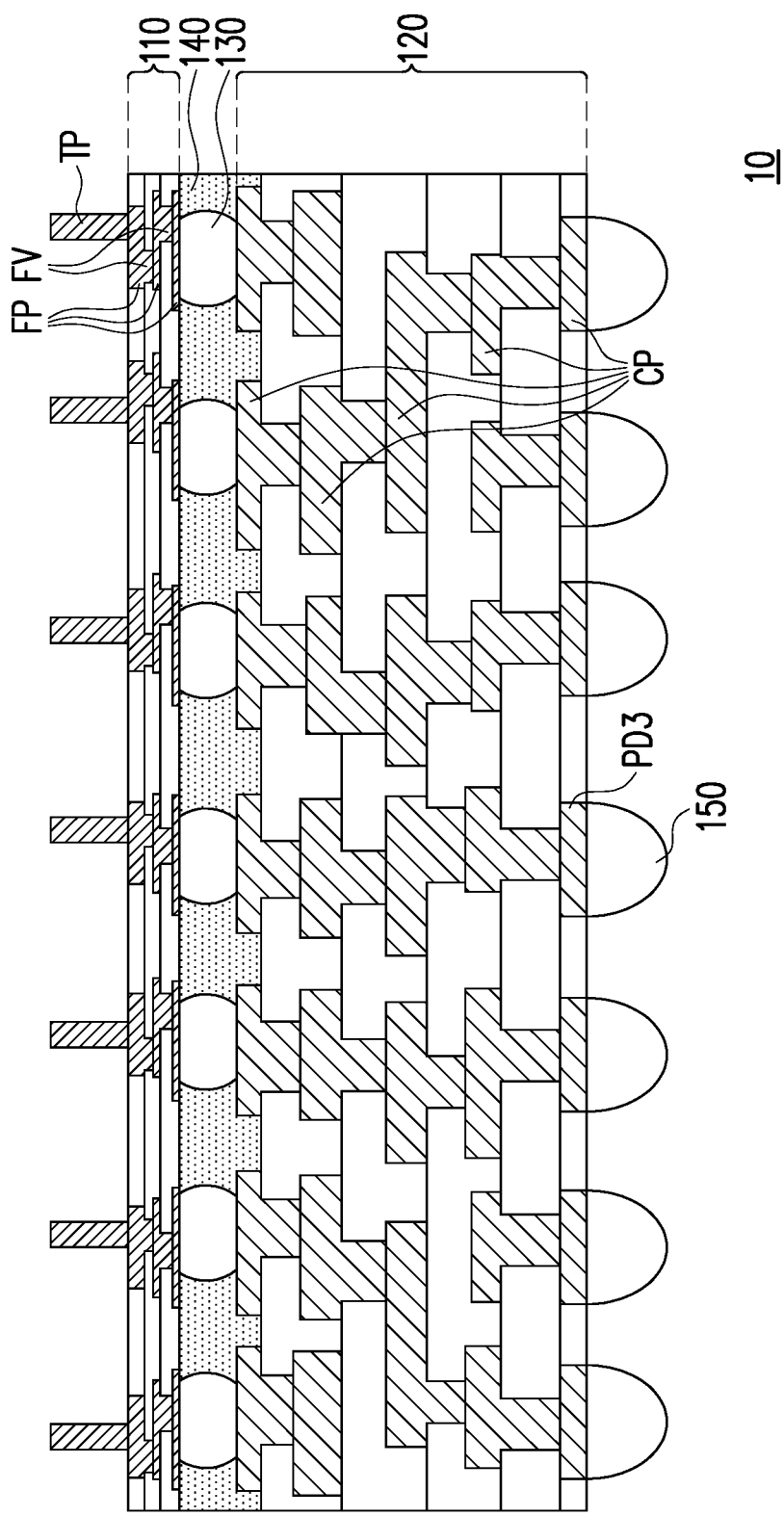

Referring to FIG. 1F, a plurality of conductive terminals 150 may be formed on the topmost one of the coarse conductive patterns CP for further electrical connection. For example, the topmost one of the coarse conductive patterns CP includes conductive pads PD3 for the conductive terminals 150 landing thereon. The dimension of the respective conductive terminal 150 may be greater than that of the respective conductive joint 130. For example, the pitch between adjacent conductive joints 130 is less than the pitch between adjacent conductive terminals 150. In some embodiments, the conductive terminals 150 are formed by ball-mounting, plating, printing, or other suitable process followed by a reflow process to form the conductive terminals 150 into the desired bump shape. The conductive terminals 150 may be or may include ball grid array (BGA) or other types of balls/bumps. Up to here, the fabrication of an integrated substrate 10 is substantially complete.

As shown in FIG. 1F, the integrated substrate 10 includes the testing tips TP formed on the first redistribution structure 110 having the fine redistribution circuitry. The testing tips TP may be used to probe a semiconductor wafer for electrical testing of the semiconductor wafer. The first redistribution structure 110 having the fine redistribution circuitry (e.g., the fine conductive patterns FP and fine conductive vias FV) may be formed to mate with fine-pitched testing tips TP. The integrated substrate 10 further includes the second redistribution structure 120 having the coarse redistribution circuitry and electrically coupled to the first redistribution structure 110 through the conductive joints 130. The second redistribution structure 120 may be rigid enough to provide the mechanical support to the integrated substrate 10.

For example, the first redistribution structure 110 is fabricated according to integrated circuit (IC) design rules, and the second redistribution structure 120 is fabricated according to PCB design rules. The design rules include width rule, spacing rule, enclosure rule, etc. For example, the minimum width of any shape in the IC design is much less than the minimum width of any shape in the PCB design. The layout density of the fine redistribution circuitry of the first redistribution structure 110 is much finer than that of the coarse redistribution circuitry of the second redistribution structure 120. The distribution layout of the fine conductive patterns FP of the first redistribution structure 110 may be denser than the distribution layout of the coarse conductive patterns CP of the second redistribution structure 120. For example, in a given area, the line/spacing of the fine conductive patterns FP is less than the line/spacing of the coarse conductive patterns CP. The integrated substrate 10 further includes the conductive terminals 150 electrically connected to the second redistribution structure 120 and located opposite to the conductive joints 130. In some embodiments, the second redistribution structure 120 is electrically coupled to a signal source carrier (e.g., testing PCB) through the conductive terminals 150.

For example, the integrated substrate 10 may be used as high performance space transformer for testing a semiconductor wafer. The integrated substrate 10 may also provide a high bandwidth and low latency scheme for probing a semiconductor wafer to be tested. It is noted that resistance and capacitance is dependent on the length of the wiring for shorter lengths, RC delay is reduced. The integrated substrate 10 also provides the interconnection including the fine redistribution circuitry and the coarse redistribution circuitry and having small RC delay. The first redistribution structure 110 and the second redistribution structure 120 are separately fabricated and then connected together through the conductive joints 130, such mechanism allows the user to easily remove and replace the first redistribution structure 110 and the testing tips TP thereon, if a malfunction of the first redistribution structure 110 and/or the testing tips TP occurs.

For example, the testing tips TP are damaged, so there is a need to replace with the new ones. Under this scenario, the testing tips TP (which include damaged tips) and the first redistribution structure 110 may be removed from the second redistribution structure 120 by heating up the assembly (as shown in FIG. 1F) above the melting point of the conductive joints 130 (e.g., solder). After refinishing the surface of the second redistribution structure 120, the second redistribution structure 120 may be ready to join a new set of testing tips TP and the first redistribution structure 110 for further electrical testing. The first redistribution structure 110 and the testing tips TP may be easily removed and replaced with another module of first redistribution structure and testing tips, depending on the type of wafer testing desired. The integrated substrate 10 provides higher integration level for heterogeneous system and lower manufacturing cost for testing semiconductor wafers.

Figure 2:
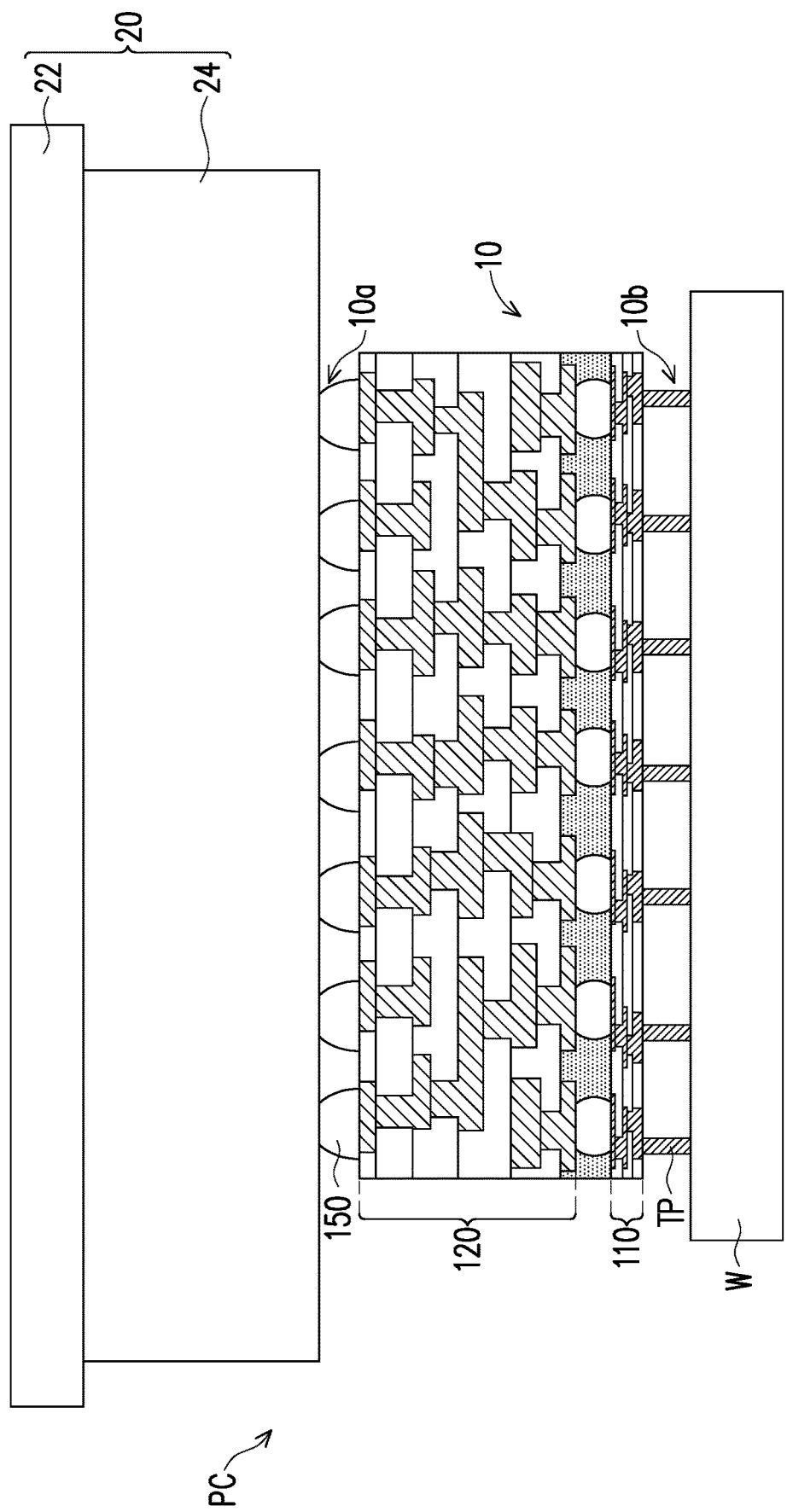
FIG. 2 is a schematic cross-sectional view illustrating a testing system including an integrated substrate for testing a semiconductor wafer according to some embodiments of the invention.

FIG. 2 is a schematic cross-sectional view illustrating a testing system including an integrated substrate for testing a semiconductor wafer according to some embodiments of the invention. The identical or similar numbers refer to the identical or similar elements throughout the drawings, and detail thereof is not repeated. Referring to FIG. 2 and also FIG. 1F, a testing system PC including an integrated substrate 10 is provided. In some embodiments, the testing system PC includes a probe card for probing and testing a semiconductor wafer W. For example, the testing system PC includes the integrated substrate 10 having a plurality of testing tips TP, and a signal source carrier 20 disposed on and coupled to the integrated substrate 10. For example, the integrated substrate 10 includes a terminal side 10*a* and a probe side 10*b* opposite to each other, where the terminal side 10*a* having the conductive terminals 150 distributed thereon is connected to the signal source carrier 20, and the probe side 10*b* having the testing tips TP distributed thereon faces the semiconductor wafer W to be tested. For example, the testing tips TP provided with fine-pitch spacing may be in direct contact with the testing pads (not shown) of the semiconductor wafer W during electrical testing.

In some embodiments, the signal source carrier 20 includes a stiffener 22 and a testing PCB 24 carried by the stiffener 22. The testing PCB 24 may serve as the signal source for providing the signal. The terminal side 10*a* of the integrated substrate 10 may face the testing PCB 24, and the conductive terminals 150 at the terminal side 10*a* of the integrated substrate 10 may be physically and electrically connected to the testing PCB 24. The signal from the testing PCB 24 may be transmitted to the semiconductor wafer W through the integrated substrate 10. In some embodiments, the integrated substrate 10 disposed between the signal source carrier 20 and the semiconductor wafer W to be tested may serve as a space transformer, since the integrated substrate 10 includes the fine redistribution circuitry of the first redistribution structure 110 connected to the testing tips TP, and the coarse redistribution circuitry of the second redistribution structure 120 connected to the conductive terminals 150. It should be noted that the testing system PC illustrated in FIG. 2 is merely exemplary, and additional elements may be disposed in the testing system PC.

Further to that described above, the integrated substrate for electrical testing a semiconductor wafer includes the fine redistribution circuitry of the first redistribution structure and the testing tips formed on the first redistribution structure. The testing tips may meet the requirements of fine-pitch spacing that are used to probe or test the semiconductor wafer. The integrated substrate also includes the coarse redistribution circuitry of the second redistribution structure and the conductive terminals formed on the coarse redistribution circuitry for electrically coupling the testing PCB, so that the testing PCB may transmit the signal to the testing tips through the second redistribution structure and the first redistribution structure.

In addition, the second redistribution structure and the first redistribution structure are separately fabricated and then connected together using conductive joints. By such mechanism, the first redistribution structure and the testing tips formed thereon may be easily removed from the second redistribution structure and replaced with another module of first redistribution structure and the testing tips. The integrated substrate can meet various pitch requirements of different types of semiconductor wafer to be tested by replacing the first redistribution structure and the testing tips. Moreover, the first redistribution structure and the testing tips can be replaced if short-circuit or broken tips occurs, without a significant increase in manufacturing cost.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method comprising:
   forming a first redistribution structure comprising a fine redistribution circuitry over a first temporary carrier;
   forming a plurality of testing tips on a first surface of the fine redistribution circuitry of the first redistribution structure;
   transferring the plurality of testing tips and the first redistribution structure to a second temporary carrier provided with a temporary adhesive layer, wherein the plurality of testing tips are embedded in the temporary adhesive layer with the second temporary carrier disposed on the temporary adhesive layer;
   releasing the first temporary carrier to expose a second surface of the fine redistribution circuitry of the first redistribution structure;
   coupling a second redistribution structure comprising a coarse redistribution circuitry to the first redistribution structure through a plurality of conductive joints, wherein the plurality of conductive joints are formed on the second surface of the fine redistribution circuitry of the first redistribution structure; and
   releasing the second temporary carrier and the temporary adhesive layer from the plurality of testing tips and the first redistribution structure after coupling the second redistribution structure.

2. The method according to claim 1, wherein:
   forming the first redistribution structure comprises forming the fine redistribution circuitry and a fine dielectric layer over the first temporary carrier, and
   after releasing the first temporary carrier, the fine redistribution circuitry and the fine dielectric layer are substantially leveled.

3. The method according to claim 1, further comprising:
   after coupling the second redistribution structure to the first redistribution structure, forming an underfill layer between the second surface of the fine redistribution circuitry of the first redistribution structure and a first surface of the second redistribution structure to laterally cover the plurality of conductive joints.

4. The method according to claim 3, wherein:
   the coarse redistribution circuitry of the second redistribution structure has coarse conductive patterns, each of the coarse conductive patterns is in contact with one of the conductive joints with a contact surface, and
   the contact surface is closer to the second surface of the first redistribution structure than the first surface of the second redistribution structure, and the contact surface is laterally covered by the underfill layer.

5. The method according to claim 1, wherein the first redistribution structure and the second redistribution structure are separately fabricated, and during coupling the second redistribution structure to the first redistribution structure, the second redistribution structure is disposed over the first redistribution structure, wherein an orthographic projection area of the second redistribution structure on the first redistribution structure is less than a surface area of the first redistribution structure.

6. The method according to claim 1, further comprising:
   after coupling the second redistribution structure to the first redistribution structure, trimming a redundant portion of the first redistribution structure that is not covered by the second redistribution structure.

7. The method according to claim 6, wherein trimming the redundant portion of the first redistribution structure is performed before releasing the second temporary carrier and the temporary adhesive layer.

8. The method according to claim 1, further comprising:
   probing a semiconductor wafer to be tested by the plurality of testing tips after releasing the second temporary carrier and the temporary adhesive layer, wherein a signal source for testing the semiconductor wafer is transmitted from the second redistribution structure to the plurality of testing tips through the plurality of conductive joints and the first redistribution structure.

9. The method according to claim 8, further comprising:
   de-coupling the first redistribution structure and the plurality of testing tips from the second redistribution structure; and
   mounting the second redistribution structure onto another module of the first redistribution structure and the plurality of testing tips.

10. The method according to claim 8, further comprising:
    forming a plurality of conductive terminals on the coarse redistribution circuitry of the second redistribution structure opposite to the plurality of conductive joints, wherein the plurality of conductive terminals is connected to the signal source for testing the semiconductor wafer before probing the semiconductor wafer to be tested.

* * * * *